US008119326B2

(12) United States Patent
Kamiya et al.

(10) Patent No.: US 8,119,326 B2
(45) Date of Patent: Feb. 21, 2012

(54) LITHOGRAPHIC-PRINTING PLATE PRECURSOR AND IMAGE FORMING METHOD USING THE SAME

(75) Inventors: Masamichi Kamiya, Ota (JP); Yasuhiro Asawa, Oata (JP); Yasushi Miyamoto, Tatebayashi (JP); Maru Aburano, Tatebayashi (JP); Eiji Hayakawa, Utsunomiya (JP)

(73) Assignee: Eastman Kodak Company, Rochester, NY (US)

(*) Notice: Subject to any disclaimer, the term of this patent is extended or adjusted under 35 U.S.C. 154(b) by 783 days.

(21) Appl. No.: 11/994,857

(22) PCT Filed: Jun. 22, 2006

(86) PCT No.: PCT/JP2006/312931
§ 371 (c)(1), (2), (4) Date: Jan. 7, 2008

(87) PCT Pub. No.: WO2007/007557
PCT Pub. Date: Jan. 18, 2007

(65) Prior Publication Data

US 2009/0208869 A1 Aug. 20, 2009

(30) Foreign Application Priority Data

Jul. 11, 2005 (JP) ................................ 2005-202306

(51) Int. Cl.
*G03F 7/095* (2006.01)
*G03F 7/035* (2006.01)

(52) U.S. Cl. ...................... 430/273.1; 430/302; 430/906

(58) Field of Classification Search ............... 430/270.1, 430/271.1, 273.1, 300, 302, 906
See application file for complete search history.

(56) References Cited

U.S. PATENT DOCUMENTS

| | | | | |
|---|---|---|---|---|
| 4,946,758 | A * | 8/1990 | Kurtz et al. | 430/259 |
| 5,126,228 | A * | 6/1992 | Higashi et al. | 430/272.1 |
| 2005/0069812 | A1* | 3/2005 | Maemoto et al. | 430/270.1 |

FOREIGN PATENT DOCUMENTS

| | | |
|---|---|---|
| JP | 63-287942 | * 11/1988 |
| JP | 2003-084430 | 3/2003 |
| JP | 2004-133433 | 4/2004 |

OTHER PUBLICATIONS

English abstract of JP 63-287942, published on Nov. 25, 1988.*
Translation of JP 63-287942, published on Nov. 25, 1988.*

* cited by examiner

*Primary Examiner* — Anca Eoff
(74) *Attorney, Agent, or Firm* — J. Lanny Tucker

(57) ABSTRACT

To provide an infrared-sensitive or heat-sensitive lithographic printing plate precursor which has high printing durability and wide development latitude, and also has good developing properties capable of preventing the formation of deposits during the development. In an infrared-sensitive or heat-sensitive lithographic printing plate precursor, comprising a substrate, a first image recording layer formed on the substrate, and a second image recording layer formed on the first image recording layer, the first image recording layer contains a resin which is soluble or dispersible in an aqueous alkali solution, and the second image recording layer contains a polyurethane which has a substituent having an acidic hydrogen atom.

19 Claims, No Drawings

LITHOGRAPHIC-PRINTING PLATE PRECURSOR AND IMAGE FORMING METHOD USING THE SAME

TECHNICAL FIELD

The present invention relates to a lithographic-printing plate precursor. More particularly, the present invention relates to an infrared-sensitive or heat-sensitive lithographic-printing plate precursor which is used as a so-called computer-to-plate (CTP) plate capable of directly recording images by irradiation with infrared ray from a solid laser or a semiconductor laser corresponding to digital signals, and an image forming method using the lithographic-printing plate precursor.

BACKGROUND ART

With the progress of computer image processing techniques, a method of directing recording images on a photosensitive layer by light irradiation corresponding to digital signals has recently been developed and thus an intense interest has been shown toward a computer-to-plate (CTP) system in which images are directly formed on a photosensitive lithographic printing plate, without outputting onto a silver salt mask film, by employing the method in a lithographic printing plate precursor. The CTP system, which uses a high-output laser having a maximum intensity within a near infrared or infrared range as a light source for light irradiation, has the following advantages: images having high resolution can be obtained by exposure within a short time and the photosensitive lithographic printing plate used in the system can be handled in daylight. Regarding solid and semiconductor lasers capable of emitting infrared ray having a wavelength of 760 to 1200 nm, a high-output and portable laser is available with ease.

By the way, as a lithographic printing plate precursor which can form images using solid laser or semiconductor laser, there has been proposed a lithographic-printing plate precursor comprising a substrate, an image recording layer formed on the substrate, and protective layer of the image recording layer so as to prevent scratching of the surface of the lithographic printing plate precursor.

In Japanese Unexamined Patent Publication (Kokai) No. 2004-157459, for example, a lithographic-printing plate precursor comprising a lower layer containing a water-insoluble and alkali-soluble polyurethane resin and an upper layer containing a m, p-cresol novolak resin is described and this lithographic printing plate precursor is excellent in printing durability and press life. However, this lithographic printing plate precursor has a problem in that it has narrow development latitude in a developing solution having the pH of 11 or lower, and also the upper layer is peeled off during the development to form deposits on a developing tank, and thus there is room for improvement in its developing properties.

DISCLOSURE OF THE INVENTION

Therefore, an object of the present invention is to provide an infrared-sensitive or heat-sensitive lithographic printing plate precursor which has high printing durability and wide development latitude, and also have good developing properties capable of preventing the formation of deposits during the development, and to provide an image forming method using the same.

The infrared-sensitive or heat-sensitive lithographic printing plate precursor of the present invention comprises a substrate, a first image recording layer formed on the substrate, and a second image recording layer formed on the first image recording layer, wherein the first image recording layer contains a resin which is soluble or dispersible in an aqueous alkali solution, and the second image recording layer contains a polyurethane which has a substituent having an acidic hydrogen atom.

The substituent having an acidic hydrogen atom is preferably a carboxyl group.

The first image recording layer and/or the second image recording layer preferably contain a photothermal conversion material.

The aqueous alkali solution preferably has the pH of 11 or lower.

The image forming method of the present invention comprises the steps of imagewise exposing the lithographic printing plate precursor of the present invention, and developing the exposed lithographic printing plate precursor and removing the exposed area, thereby to form the image area comprising a first image recording layer and a second image recording layer, and the non-image area.

EFFECT OF THE INVENTION

The lithographic printing plate precursor and the image forming method of the present invention have high printing durability and have wide development latitude to a developing solution having the pH of 11 or lower, and are also less likely to form deposits during the development because the first and second image recording layers constituting the image area are not peeled off by the developing solution. As described above, the lithographic printing plate precursor and the image forming method of the present invention have good developing properties.

Furthermore, the lithographic printing plate precursor and the image forming method of the present invention can provide positive images with high resolution, and are also excellent in resistance to a UV ink detergent and is suited for UV ink printing.

BEST MODE FOR CARRYING OUT THE INVENTION

The present invention will now be described in detail.

The lithographic printing plate precursor of the present invention comprises a first layer as an image recording layer on a substrate and also comprises a second layer as the same image recording layer on the first layer. The substrate, the first image recording layer and the second image recording layer may be laminated in order. If necessary, an intermediate layer may be formed between the respective layers. If necessary, a back coat layer may be formed on the back surface of the substrate. In view of simplification of the production, it is preferred that the first image recording layer is formed by being contacted with the surface of the substrate and also the second image recording layer is formed by being contacted with the surface of the first image recording layer.

<First Image Recording Layer>

The first image recording layer constituting the lithographic printing plate precursor of the present invention contains a resin which is soluble or dispersible in an aqueous alkali solution. In order to enable the resin to be soluble or dispersible in the aqueous alkali solution, the resin preferably has at least one functional group selected from the group consisting of hydroxyl group, carboxyl group, sulfonic acid group, phosphoric acid group, imide group and amide group. Therefore, the resin, which is soluble or dispersible in the aqueous alkali solution, can be preferably produced by polymerizing a monomer mixture containing at least one ethylenically unsaturated monomer having a functional group selected from the group consisting of hydroxyl group, carboxyl group, sulfonic acid group, phosphoric acid group, imide group, amide group, and a combination thereof.

The ethylenically unsaturated monomer may be a compound represented by the following formula:

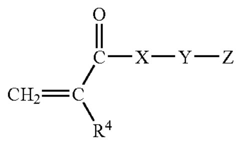

wherein $R^4$ represents a hydrogen atom, a $C_{1-22}$ linear, branched or cyclic alkyl group, a $C_{1-22}$ linear, branched or cyclic substituted alkyl group, or a $C_{6-24}$ aryl or substituted aryl group, the substituent being selected from a $C_{1-4}$ alkyl group, an aryl group, a halogen atom, a keto group, an ester group, an alkoxy group and a cyano group;

X represents O, S or $NR^5$, $R^5$ represents hydrogen, a $C_{1-22}$ linear, branched or cyclic alkyl group, a $C_{1-22}$ linear, branched or cyclic substituted alkyl group or a $C_{6-24}$ aryl group or substituted aryl group, the substituent being selected from a $C_{1-4}$ alkyl group, an aryl group, a halogen atom, a keto group, an ester group, an alkoxy group and a cyano group;

Y represents a single bond, or $C_{1-22}$ linear, branched or cyclic alkylene, alkyleneoxyalkylene, poly(alkyleneoxy)alkylene or alkylene-NHCONH;

Z represents a hydrogen atom, a hydroxy group, carboxylic acid, $—C_6H_4—SO_2NH_2$, $—C_6H_3—SO_2NH_2(—OH)$, or a group represented by the following formula:

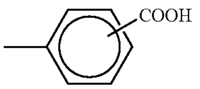
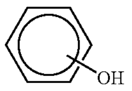
or
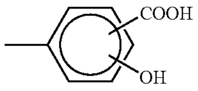

or a mixture thereof.

Examples of the ethylenically unsaturated monomer include, in addition to acrylic acid and methacrylic acid, compounds represented by the following formulas and a mixture thereof.

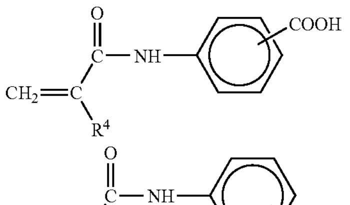

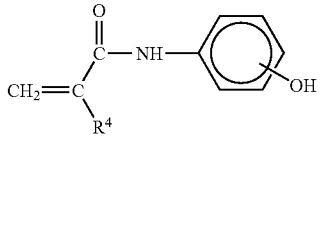

-continued

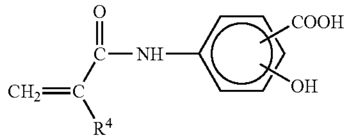

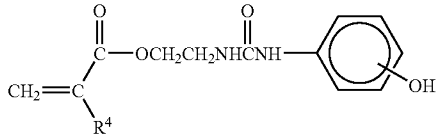

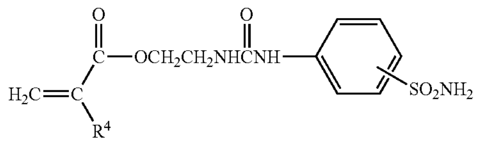

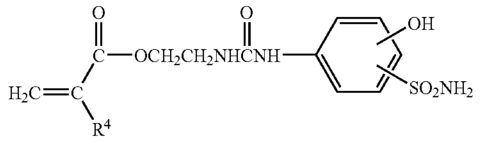

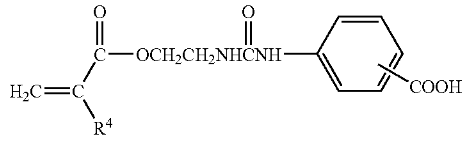

The monomer mixture may contain the other ethylenically unsaturated comonomer. Examples of the other ethylenically unsaturated comonomer include the following monomers:

acrylate esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate and tetrahydroacrylate;

aryl acrylates such as phenyl acrylate and furfuryl acrylate;

methacrylate esters such as methyl methacrylate, ethyl methacrylate, propyl methacrylate, isopropyl methacrylate, allyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate;

aryl methacrylates such as pheny methacrylate, cresyl methacrylate and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide and N-benzylacrylamide;

N-arylacrylamides such as N-phenylacrylamide, N-tolylacrylamide, N-nitrophenylacrylamide, N-naphthylacrylamide and N-hydroxyphenylacrylamide;

N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide and N,N-dicyclohexylacrylamide;

N,N-arylacrylamides such as N-methyl-N-phenylacrylamide, N-hydroxyethyl-N-methylacrylamide and N-2-acetamideethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate, and allyloxyethanol;

vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinyl naphthyl ether and vinyl anthranyl ether;

vinylesters such as vinyl butyrate, vinyl isobutyrate, vinyltrimethyl acetate, vinyldiethyl acetate, vinyl valerate, vinyl caproate, vinylchloro acetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene and 4-fluoro-3-trifluoromethylstyrene;

crotonate esters such as butyl crotonic crotonate, hexyl crotonate, crotonic acid and glycerin monocrotonate;

alkyl itaconates such as dimethyl itaconate, diethyl itaconate and dibutyl itaconate;

dialkyls of maleic acid or fumaric acid, such as dimethyl fumarate and dibutyl fumarate;

maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenymaleimide, N-cyclohexylmaleimide, N-laurylmaleimide and N-hydroxyphenylmaleimide; and nitrogen atom-containing monomers such as N-vinyl pyrrolidone, N-vinylpyridine, acrylonitrile and methacrylonitrile.

Among these other ethylenically unsaturated comonomer monomers, for example, (meth)acrylate esters, (meth)acrylamides, maleimides and (meth)acrylonitriles are preferably used.

The content of the resin, which is soluble or dispersible in the aqueous alkali solution, in the first image recording layer is preferably within a range from 20 to 95% by weight based on the weight of the solid content. A content of the resin, which is soluble or dispersible in the aqueous alkali solution, of less than 20% by weight is not preferable in view of chemical resistance. A content of the resin of more than 95% by weight is not preferable in view of an exposure rate. If necessary, two or more kinds of the resins, which are soluble or dispersible in the aqueous alkali solution, may be used in combination.

<Second Image Recording Layer>

The second image recording layer constituting the lithographic printing plate precursor of the present invention contains a polyurethane which has a substituent having an acidic hydrogen atom. The acidic hydrogen atom belongs to an acidic functional group such as carboxyl group, $—SO_2NHCOO—$ group, $—CONHSO_2—$ group, $—CONHSO_2NH—$ group or $—NHCONHSO_2—$ group, but is particularly preferably derived from a carboxyl group.

The polyurethane having an acidic hydrogen atom can be synthesized by a method of reacting a diol having a carboxyl group and, if necessary, another diol and a diisocyanate; a method of reacting a diol, a diisocyanate having a carboxyl group and, if necessary, another diisocyanate; or a method of reacting a diol having a carboxyl group and, if necessary, another diol, a diisocyanate having a carboxyl group and, if necessary, another diisocyanate.

Examples of the diol having a carboxyl group include 3,5-dihydroxybenzoic acid, 2,2-bis(hydroxymethyl)propionic acid, 2,2-bis(hydroxyethyl)propionic acid, 2,2-bis(3-hydroxypropylpropionic acid, 2,2-bis(hydroxymethyl)acetic acid, bis-(4-hydroxyphenyl)acetic acid, 4,4-bis-(4-hydroxyphenyl)pentanoic acid and tartaric acid, and 2,2-bis(hydroxymethyl)propionic acid is more preferable in view of reactivity with isocyanate.

Examples of the other diol include dimethylolpropane, polypropylene glycol, neopentyl glycol, 1,3-propanediol, polytetramethylene ether glycol, polyesterpolyol, polymerpolyol, polycaprolactonepolyol, polycarbonatediol, 1,4-butanediol, 1,5-pentadiol, 1,6-hexanediol and polybutadienepolyol.

Examples of the diisocyanate having a carboxyl group include dimer acid diisocyanate.

Examples of the other diisocyanate include 4,4'-diphenylmethane diisocyanate, xylylene diisocyanate, naphthylene-1,5-diisocyanate, tetramethylxylene diisocyanate, hexamethylene diisocyanate, toluene-2,4-diisocyanate, isophorone diisocyanate, hydrogenated xylylene diisocyanate, dicyclohexylmethane diisocyanate, norbornene diisocyanate and trimethylhexamethylene diisocyanate.

A molar ratio of the diisocyanate to the diol is preferably from 0.7:1 to 1.5:1. In case an isocyanate group remains at the end of the polymer, when treated with alcohols or amines, synthesis is conducted without the isocyanate group remaining, finally.

A weight average molecular weight of the polyurethane which has a substituent having an acidic hydrogen atom is preferably within a range from 2,000 to 100,000. When the weight average molecular weight of the polyurethane is less than 2,000, the image area obtained by forming images tends to be insufficient in durability, resulting in poor printing durability. On the other hand, when the weight average molecular weight of the polyurethane is more than 100,000, sensitivity tends to be poor.

The content of the polyurethane which has a substituent having an acidic hydrogen atom in the second image recording layer is preferably within a range from 2 to 90% by weight based on the weight of the solid content of the layer. The content of the polyurethane having a substituent having an acidic hydrogen atom of less than 2% by weight is not preferable in view of a developing rate. The content of more than 90% by weight is not preferable in view of storage stability. If necessary, two or more kinds of the polyurethanes which have a substituent having an acidic hydrogen atom may be used in combination.

<Photothermal Conversion Material>

The first image recording layer and/or the second image recording layer may contain a photothermal conversion material. The photothermal conversion material means any material capable of converting electromagnetic waves into thermal energy and is a material having a maximum absorption wavelength within a near infrared or infrared range, for example, a material having a maximum absorption wavelength within a range from 760 to 1200 nm. Examples of such a substance include various pigments and dyes.

The pigments used in the present invention are commercially available pigments described, for example, in "Color Index Handbook, "Latest Pigment Handbook" (edited by Nihon Pigment Technique Society, published in 1977), "Latest Pigment Application Technique" (published by CMC in 1986), and "Printing Ink Technique" (published by CMC in 1984). Applicable types of pigments include black, yellow, orange, brown, red, violet, blue and green pigments, fluorescent pigments and polymer-grafted dyes. For example, there can be used insoluble azo pigments, azo lake pigments, condensed azo pigments, chelated azo pigments, phthalocyanine pigments, anthraquinone pigments, perylene and perinone pigments, thiomindigo pigments, guinacridone pigments, dioxazine pigments, isoindolinone pigments, quinophthalone pigments, lake pigments, azine pigments, nitroso pigments, nitro pigments, natural pigments, fluorescent pigments, inorganic pigments and carbon black.

Among these pigments, carbon black is preferably used as a material which efficiently absorbs light in a near infrared or infrared range and is also economically excellent. As the carbon black, grafted carbon blacks having various functional groups, which are excellent in dispersibility, are commercially available and examples thereof include those described on page 167 of "The Carbon Black, Handbook, 3rd edition" (edited by the Carbon Black Society of Japan and issued in 1995" and those described in page 111 of "Characteristics, Optimum Blending and Applied Technique of Carbon Black" (edited by Technical Information Society in 1997), all of which are preferably used in the present invention.

These pigments may be used without surface treatment, or may be used after subjected to a surface treatment. As a method of surface treatment, there can be contemplated a method of surface-coating a resin or a wax, a method of attaching a surfactant, and a method of binding a reactive substance (e.g. silane coupling agent, epoxy compound, polyisocyanate etc.) to the surface of a pigment. The above-mentioned surface treating methods are described in "Property and Application of Metal Soap" (Saiwai Shobou), "Printing Ink Technique" (published by CMC in 1984) and "Latest Pigment Application Technique" (published by CMC in 1986). The particle size of these pigments is preferably within a range from 0.01 to 15 μm, and more preferably from 0.01 to 5 μm.

The dyes used in the present invention are conventionally known commercially available dyes described, for example, in "Dye Handbook" (edited by the Association of Organic Synthesis Chemistry, published in 1970), "Handbook of Color Material Engineering" (edited by the Japan Society of Color Material, Asakura Shoten K. K., published in 1989), "Technologies and Markets of Industrial Dyes" (published by CMC in 1983), and "Chemical Handbook, Applied Chemistry Edition" (edited by The Chemical Society of Japan, Maruzen Shoten K. K., published in 1986). Specific examples of the dyes include azo dyes, azo dyes in the form of metal complex salts, pyrazolone azo dyes, anthraquinone dyes, phthalocyanine dyes, carbonium dyes, quinonimine dyes, methine dyes, cyanine dyes, indigo dyes, quinoline dyes, nitro-based dyes, xanthene-based dyes, thiazine-based dyes, azine dyes, and oxazine dyes.

As the dyes capable of efficiently absorbing near infrared ray or infrared ray, for example, there can be used dyes such as azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salts and metal thiolate complexes (for example, nickel thioate complex). Among these, cyanine dyes are preferable, and cyanine dyes represented by the general formula (I) of Japanese Unexamined Patent Publication (Kokai) No. 2001-305722 and compounds described in paragraphs [0096] to [0103] of Japanese Unexamined Patent Publication (Kokai) No. 2002-079772 can be exemplified.

The photothermal conversion materials are particularly preferably dyes represented by the following formulas:

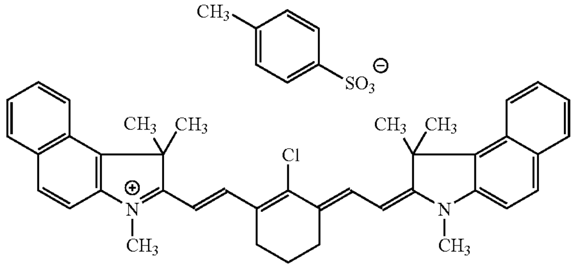

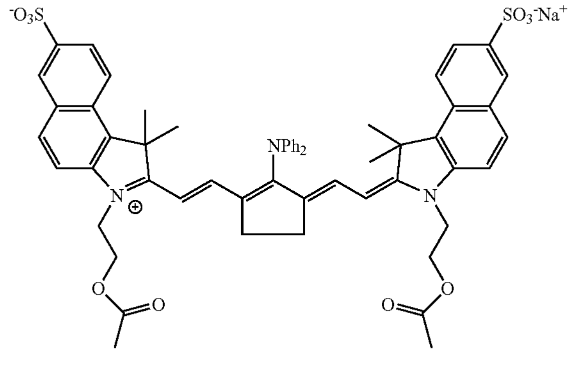

wherein Ph represents a phenyl group.

The photothermal conversion material can be added in the image recording layer in the amount within a range from 0.01 to 50% by weight, preferably from 0.1 to 20% by weight, and particularly preferably from 1 to 15% by weight, based on the first and/or second image recording layers. When the amount is less than 0.01% by weight, sensitivity decreases. On the other hand, when the amount is more than 50% by weight, the non-image area may be contaminated during printing. These photothermal conversion materials may be used or in combination.

<Substrate>

Examples of the substrate include metal plates such as aluminum, zinc, copper, stainless steel and iron plates; plastic films such as polyethylene terephthalate, polycarbonate, polyvinyl acetal and polyethylene films; composite materials obtained by vacuum-depositing or laminating a metal layer on papers or plastic films on which a synthetic resin is melt-coated or a synthetic resin solution is coated; and materials used as the substrate of the printing plate. Among these substrates, aluminum and composite substrates coated with aluminum are preferably used.

The surface of the aluminum substrate is preferably subjected to a surface treatment for the purpose of enhancing water retention and improving adhesion with the first image recording layer or the intermediate layer formed optionally. Examples of the surface treatment include surface roughening treatments such as brush graining, ball graining, electrolytic etching, chemical graining, liquid honing, sand blasting, and a combination thereof. Among these surface treatments, a surface roughening treatment including the use of electrolytic etching is preferable.

As the electrolytic bath used in the electrolytic etching, an aqueous solution containing acid, alkali or a salt thereof, or an aqueous solution containing an organic solvent is used. Among these, an electrolytic solution containing hydrochloric acid, nitric acid, or a salt thereof is preferable.

The aluminum plate subjected to the surface roughening treatment is subjected to desmutting using an aqueous solution of an acid or alkali, if necessary. The aluminum substrate thus obtained is preferably subjected to an anodizing treatment. An anodizing treatment of treating using a bath containing sulfuric acid or phosphoric acid is particularly preferable.

If necessary, the aluminum substrate is preferably subjected silicate treatment (sodium silicate, potassium silicate), potassium fluorozirconate treatment, phosphomolybdate treatment, alkyl titanate treatment, polyacrylic acid treatment, polyvinylsulfonic acid treatment, polyvinylphosphonic acid treatment, phytic acid treatment, treatment with a salt of hydrophilic organic polymer compound and divalent metal, hydrophilization treatment by undercoating with a water soluble polymer having an sulfonic acid group, coloring treatment with an acidic dye, and electrodeposition with silicate.

An aluminum substrate subjected to a sealing treatment after subjecting to the surface roughening treatment (graining treatment) and the anodizing treatment is also preferable. The sealing treatment can be conducted by dipping an aluminum substrate in hot water or a hot water solution containing an inorganic or organic salt.

The lithographic printing plate precursor of the present invention is produced by coating a solution or dispersion prepared by constituent components of a first image recording layer and a second image recording layer in an organic solvent in order on a substrate, followed by drying to form a first image recording layer and a second image recording layer on the substrate.

As the organic solvent in which the constituent components of the first image recording layer and the second image recording layer, any conventionally known organic solvent can be used. An organic solvent having a boiling point within a range from 40 to 200° C., and particularly from 60 to 160° C. is selected in view of an advantage on drying.

Examples of the organic solvent include alcohols such as methyl alcohol, ethyl alcohol, n- or iso-propy lalcohol, n- or iso-butylalcohol and diacetone alcohol; ketones such as acetone, methyl ethyl ketone, methyl propyl ketone, methyl buty lketone, methyl amyl ketone, methyl hexyl ketone, diethyl ketone, diisobutyl ketone, cyclohexanone, methyl cyclohexanone and acetyl acetone; hydrocarbons such as hexane, cyclohexane, heptane, octaane, nonane, decane, benzene, toluene, xylene and methoxybenzene; acetate esters such as ethyl acetate, n- or iso-propyl acetate, n- or iso-butyl acetate, ethylbutyl acetate and hexyl acetate; halides such as methylene dichloride, ethylene dichloride and monochlorobenzene; ethers such as isopropyl ether, n-butyl ether, dioxane, dimethyldioxane and tetrahydrofuran; polyhydric alcohols such as ethylene glycol, ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate, ethylene glycol dimethyl ether, ethylene glycol diethyl ether, ethylene glycol dibutyl ether, methoxyethoxy ethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, 1-methoxy-2-propanol, and derivatives thereof; and special solvents such as dimethyl sulfoxide, N,N-dimethyl formamide, methyl lactate and ethyl lactate. These organic solvents are used alone or in combination. The concentration of the solid content in the solution or dispersion to be coated is preferably from 2 to 50% by weight. The solid content in the present invention refers to components excluding the organic solvent.

As the method of coating the solution or dispersion of constituent components of the first image recording layer and the second image recording layer, for example, roll coating, dip coating, air knife coating, gravure coating, gravure offset coating, hopper coating, blade coating, wire doctor coating and spray coating methods are used. The coating weight is within a range from 10 to 100 ml/$m^2$.

The solution or dispersion coated on the substrate is usually dried with a heated air. The drying temperature (the temperature of the heated air) is preferably within a range from 30 to 200° C., and particularly preferably from 40 to 140° C. As the drying method, not only a method of maintaining the drying temperature at a predetermined temperature during drying, but also a method of increasing the drying temperature stepwise can be carried out.

Preferable results can also obtained by dehumidifying the drying air. The dried air is preferably supplied to the surface to be coated at a rate within a range from 0.1 to 30 m/second, and particularly from 0.5 to 20 m/second.

Each coating weight of the first image recording layer and the second image recording layer is usually within a range from about 0.1 to 5 g/$m^2$ on a dry weight basis.

<Other Constituent Components of First and Second Image Recording Layers>

To the lithographic printing plate precursor of the first and/or second image recording layer of the present invention, known additives such as colorants (dyes, pigments), surfactants, plasticizers, stability modifiers, development accelerators, development restrainers and lubricants (silicone powder) can be added.

Examples of preferable dyes include basic oil-soluble dyes such as Crystal Violet, Malachite green, Victoria Blue, Methylene Blue, Ethyl Violet and Rhodamine B. Examples of the commercially available dye include "Victoria Pure Blue BOH" [manufactured by HODOGAYA CHEMICAL Co., Ltd.], "Oil Blue #603" [manufactured by Orient Chemical Industries, LTD.], "VPB-Naps (naphthalenesulfonate of Victoria Pure Blue)" [manufactured by HODOGAYA CHEMICAL Co., Ltd.] and "D11" [manufactured by PCAS Co.]; and pigments such as Phthalocyanine Blue, Phthalocyanine Green, Dioxadine Violet and Quinacridone Red.

Examples of surfactants include fluorine-based surfactants and silicone-based surfactants.

Examples of plasticizers include diethyl phthalate, dibutyl phthalate, dioctyl phthalate, tributyl phosphate, trioctyl phosphate, tricresyl phosphate, tri(2-chloroethyl) phosphate and tributyl citrate.

As the stabilizer, for example, phosphoric acid, phosphorous acid, oxalic acid, tartaric acid, malic acid, citric acid, dipicolinic acid, polyacrylic acid, benzenesulfonic acid and toluenesulfonic acid can be used in combination.

Examples of other stability modifiers include known phenolic compounds, quinones, N-oxide compounds, amine-based compounds, sulfide group-containing compounds, nitro group-containing compounds and transition metal compounds. Specific examples thereof include hydroquinone, p-methoxyphenol, p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenimidazole and N-nitrosoenylhydroxyamine primary cerium salt.

Examples of development accelerators include acid anhydrides, phenols and organic acids. The acid anhydrides are preferably cyclic anhydrides. For example, there can be used, as the cyclic acid anhydride, phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic ahydride, α-phenyl maleic anhydride, succinic anhydride and pyromellitic anhydride described in the description of U.S. Pat. No. 4,115,128. Examples of the non-cyclic acid anhydride include acetic anhydride. Examples of phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of organic acids include sulfonic acids, sulfonic acids, alkylsulfuric acids, phosphonic acids, phosphate esters and carboxylic acids described in Japanese Unexamined Patent Publication (Kokai) No. 60-88942 and Japanese Unexamined Patent Publication (Kokai) No. 2-96755, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The development restrainer is not specifically limited as far as it interacts with the alkali-soluble resin and substantially reduces solubility in a developing solution of the alkali-soluble resin in the non-exposed area and also makes the exposed area soluble in the developing solution as a result of a weakened interaction, and quaternary ammonium salts and polyethylene glycol-based compounds are preferably used. Among the above-described infrared absorbers and colorants, compounds capable of functioning as the development restrainer are present and are preferably exemplified. There can also be exemplified substances, which are pyrolytic and substantially deteriorate solubility of the alkali-soluble resin in the non-decomposed state, such as onium salts, o-quinonediazide compound, aromatic sulfone compounds and aromatic sulfonate ester compounds.

The amount of these various additives vary depending on the purposes, but is preferably within a range from 0 to 30% by weight based on the solid content of the first or second image recording layer.

In the image recording layer of the lithographic printing plate precursor of the present invention, other alkali-soluble or dispersible resins may be used in combination, if necessary. Examples of the other alkali-soluble or dispersible resin include copolymers of alkali-soluble group-containing monomers such as acrylic acid, methacrylic acid, maleic acid, maleic anhydride, itaconic acid and itaconic anhydride and the other monomer, polyester resin and acetal resin.

The lithographic printing plate precursor of the present invention may contain a matting agent in the image recording layer for the purpose of improving interleaving paper peelability and plate transportation properties of an automatic plate feeding apparatus, or a matting layer may be formed on the second image recording layer.

<Exposure and Development>

The infrared-sensitive or heat-sensitive lithographic printing plate precursor of the present invention can be used as a so-called computer-to-plate (CTP) plate capable of directly recording images on a plate using laser based on digital image information from a computer.

As a light source of laser in the present invention, a high-output laser having a maximum intensity within a near infrared or infrared range is used most preferably. Examples of the high-output laser having a maximum intensity within a near infrared or infrared range include various lasers having a maximum intensity within a near infrared or infrared range of 760 to 1200 nm, for example, semiconductor and YAG laser.

The lithographic printing plate precursor of the present invention is provided for an image forming method comprising recording images on the photosensitive layer using laser, followed by a development treatment and further removal of the non-image area using a wet method. That is, according to the image forming method of the present invention, images are formed through the steps of imagewise exposing the lithographic printing plate precursor of the present invention, and developing the exposed lithographic printing plate precursor and removing the exposed area, thereby to form the image area comprising a first image recording layer and a second image recording layer, and the non-image area.

Examples of the developing solution used in a developing treatment include an aqueous alkali solution (aqueous basic solution). The pH of the aqueous alkali solution is preferably 11 or lower. Specifically, the pH is preferably from 6 to 11, more preferably from 8 to 11, and particularly preferably from 10 to 11.

Examples of the alkali agent used in the developing solution include inorganic alkali compounds such as sodium silicate, potassium silicate, potassium hydroxide, sodium hydroxide, lithium hydroxide, sodium, potassium or ammonium salts of secondary or tertiary phosphoric acid, sodium metasilicate, sodium carbonate, and ammonia; and organic alkali compounds such as monomethylamine, dimethylamine, trimethylamide, monoethylamine, diethylamine, triethylamine, monoisopropylamine, diisopropylamine, n-butylamine, di-n-butylamine, monoethanolamine, diethanolamine, triethanolamine, ethyleneimine and ethylenediamine.

The content of the alkali agent in the developing solution is preferably within a range from 0.005 to 10% by weight, and particularly preferably from 0.05 to 5% by weight. The content of the alkali agent in the developing solution of less than 0.005% by weight is not preferable because the development may not be conducted sufficiently. The content of more than 10% by weight is not preferable because an adverse influence such as corrosion of the image area is exerted on development.

An organic solvent can also be added to the developing solution. Examples of the organic solvent, which can be added to the developing solution, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methylphenyl carbitol, n-amyl alcohol, methylamyl alcohol, xylene, methylene dichloride, ethylene dichloride and monochlorobenzene. When the organic solvent is added to the developing solution, the content of the organic solvent is preferably 20% by weight or less, and particularly preferably 10% by weight or less.

If necessary, it is also possible to add, in the developing solution, water soluble sulfites such as lithium sulfite, sodium sulfite, potassium sulfite and magnesium sulfite; hydroxyaromatic compounds such as alkali soluble pyrazolone compound, alkali soluble thiol compound and methyl resorcin; water softeners such as polyphosphate and aminopolycarboxylic acids; various surfactants, for example, anionic, cationic, amphoteric and fluorine-based surfactants such as sodium isopropylnaphthalenesulfonate, sodium n-butylnaphthalene sulfonate, sodium N-methyl-N-pentadecyl aminoacetate and sodium lauryl sulfate; and various defoamers.

As the developing solution, commercially available developing solutions for negative or positive type PS plate can be used. Specifically, a solution prepared by diluting a commercially available concentrated developing solution for negative or positive type PS plate 1 to 1000 times can be used as the developing solution in the present invention.

The temperature of the developing solution is preferably within a range from 15 to 40° C. and the dipping time is preferably within a range from 1 second to 2 minutes. If necessary, the surface can be slightly rubbed during the development.

After the completion of the development treatment, the lithographic printing plate is washed with water and/or subjected to a treatment with an aqueous desensitizing agent (finishing gum). Examples of the aqueous desensitizing agent include aqueous solutions of water soluble natural polymers such as gum arabic, dextrin and carboxymethyl cellulose, and aqueous solutions of water soluble synthetic polymers such as polyvinyl alcohol, polyvinyl pyrrolidone and polyacrylic acid. If necessary, acids or surfactants are added to these aqueous desensitizing agents. After being subjected to a treatment with the desensitizing agent, the lithographic printing plate is dried and then used for printing as a printing plate.

For the purpose of improving printing durability of the resulting lithographic printing plate, the lithographic printing plate may be subjected to a burning treatment after the developing treatment.

The burning treatment is carried out by the steps of (i) washing the lithographic printing plate with water and removing a rinsing solution or a gum solution, followed by squeegeeing, (ii) uniformly spreading a counter-etching solution over the entire plate, followed by drying, (iii) burning the plate in an oven under the temperature conditions of 180 to 300° C. for 1 to 30 minutes, and (iv) cooling the plate, washing the plate with water to remove the counter-etching solution, followed by gum coating and further drying.

According to the lithographic printing plate precursor of the present invention described above, positive images with high resolution can be provided using infrared laser and the lithographic printing plate precursor is excellent in resistance to a solvent for washing UV ink and is also suited for UV ink printing because the first image recording layer itself has solvent resistance.

EXAMPLE

The present invention will now be described in detail by way of examples, but the present invention is not limited to the scope of the following examples.

Synthesis Example 1

In a 500 ml three-necked round bottom flask equipped with a concentrator and a stirrer, 2.7 g of 4,4'-diphenylmethane diisocyanate, 14.5 g of toluene-2,4-diisocyanate, 7.0 g of neopentyl glycol, 35.8 g of 2,2-bis(hydroxymethyl)propionic acid and 280 g of 3-pentanone were charged. After adding 0.3 g of dibutyltin didodecanoate, the reaction mixture was heated to 80° C. while stirring. The reaction was continued at 80° C. for 6 hours. Thus, a polyurethane (1) was obtained. A weight average molecular weight as determined by GPC was 24,000. An acid value was 125.

Synthesis Examples 2 to 9

In the same manner as in Synthesis Example 1, except that diisocyanates and diols shown in Table 1, polyurethanes (2) to (9) were obtained.

TABLE 1

Diisocyanates and diols of Synthesis Examples 2 to 9

| No. | Diisocyanates | ratio | Diols | ratio |
|---|---|---|---|---|
| (2) | 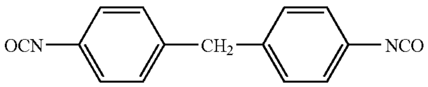 | | 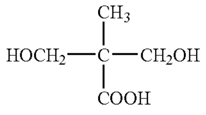 | |
| | | diisocyanate:diol = 1.5:1, molecular weight: 7,000 | | |
| (3) | 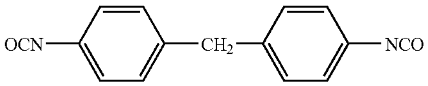 | | 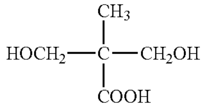 | 75 mol % |

TABLE 1-continued

| Diisocyanates and diols of Synthesis Examples 2 to 9 | | | | |
|---|---|---|---|---|
| No. | Diisocyanates | ratio | Diols | ratio |
| | | | 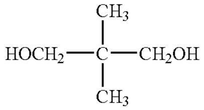 | 25 mol % |
| | diisocyanate:diol = 1:1.2, molecular weight: 12,000 | | | |
| (4) | 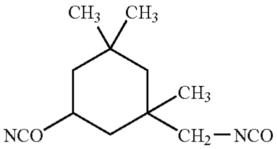 | 75 mol % | 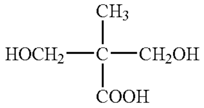 | 80 mol % |
| | 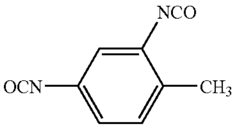 | 25 mol % | 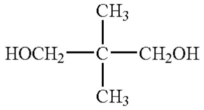 | 20 mol % |
| | diisocyanate:diol = 1:1.1, molecular weight: 17,000 | | | |
| (5) | 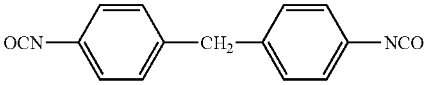 | 80 mol % | 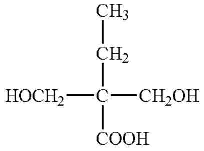 | |
| | 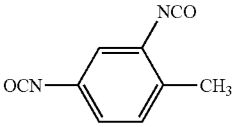 | 20 mol % | | |
| | diisocyanate:diol = 1:1, molecular weight: 23,000 | | | |
| (6) | 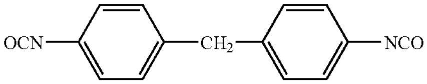 | 75 mol % | 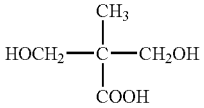 | 75 mol % |
| | 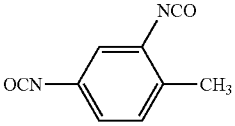 | 25 mol % | 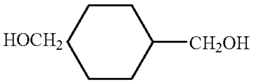 | 25 mol % |
| | diisocyanate:diol = 1:1, molecular weight: 25,000 | | | |
| (7) | 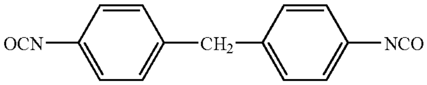 | | 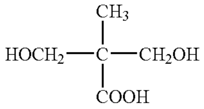 | 85 mol % |
| | | | HO—$(CH_2)_6$—OH | 15 mol % |
| | diisocyanate:diol = 1:1.05, molecular weight: 20,000 | | | |
| (8) | 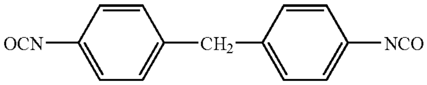 | 75 mol % | 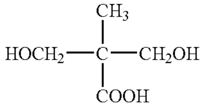 | 80 mol % |

TABLE 1-continued

| Diisocyanates and diols of Synthesis Examples 2 to 9 | | | | |
|---|---|---|---|---|
| No. | Diisocyanates | ratio | Diols | ratio |
| | $OCN—(CH_2)_6—NCO$ | 25 mol % | 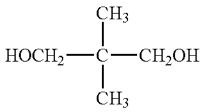 | 20 mol % |
| diisocyanate:diol = 1:1.05, molecular weight: 19,000 | | | | |
| (9) | 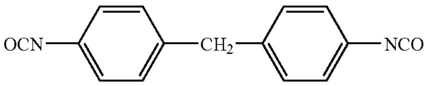 | 80 mol % | 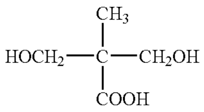 | 85 mol % |
| | 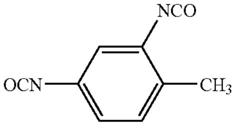 | 20 mol % | 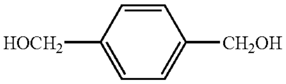 | 15 mol % |
| diisocyanate:diol = 1:1.1, molecular weight: 18,000 | | | | |

Example 1

Substrate

The surface of an aluminum sheet was subjected to an electrolytic roughening treatment using 2% hydrochloric acid. An average roughness Ra was 0.5 μm. Furthermore, the aluminum sheet was subjected to an anodizing treatment in an aqueous 20% sulfuric acid solution to form 2.7 $g/m^2$ of an oxide film. The anodized aluminum sheet was dipped in an aqueous 2.5% sodium silicate at 70° C. for 30 minutes, washed with water and then dried.

(Image Recording Layer)

On the substrate thus obtained, a coating solution 1 for a lower layer shown in Table 2 was coated in a coating weight of 1.5 $g/m^2$ using a bar coater, followed by drying at 130° C. for 40 seconds and further cooling to 35° C. Furthermore, a coating solution 1 for an upper layer shown in Table 3 was coated in a coating weight of 0.5 $g/m^2$ using a bar coater, followed by drying at 135° C. for 40 seconds and further slow cooling to a temperature of 20 to 26° C. Thus, a lithographic printing plate precursor was obtained.

TABLE 2

| Coating solution 1 for lower layer | |
|---|---|
| Components | Amount |
| N-phenylmaleimide/methacrylic acid/methacrylamide copolymer<br>Weight ratio: 59/15/26<br>Mw: 50,000 | 5.21 g |
| Infrared absorbing dye of the following Chemical Formula 8 | 0.94 g |
| Crystal Violet (manufactured by HODOGAYA CHEMICAL Co., Ltd.) | 0.08 g |
| BYK307 (BYK Chemie) | 0.03 g |
| Methyl ethyl ketone | 61.00 g |
| Propylene glycol monomethyl ether | 14.00 g |
| γ-butyrolactone | 9.40 g |
| Water | 9.34 g |

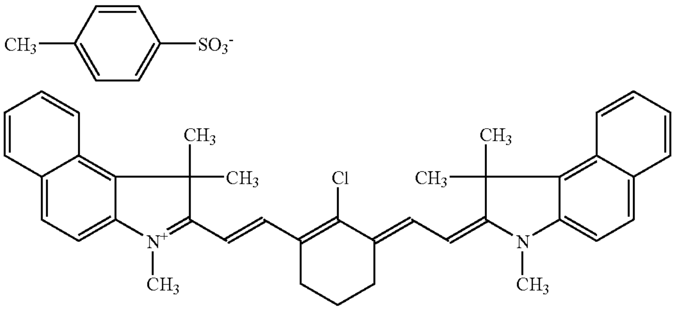

TABLE 3

| Coating solution 1 for upper layer | |
|---|---|
| Components | Amount |
| Polyurethane (1) of Synthesis Example 1 (25% solution) | 30.00 g |
| Ethyl Violet | 0.03 g |
| Fluorine-based surfactant (Megafac F-176) (20% solution) | 0.05 g |
| 3-pentanone | 62.50 g |
| Propylene glycol 1-monomethylether 2-acetate | 7.42 g |

Examples 2 to 9

In the same manner as in Example 1, except that the polyurethanes (2) to (9) obtained in Synthesis Examples 2 to 9 were used in place of the polyurethane (1), lithographic printing plate precursors were obtained.

Example 10

In the same manner as in Example 1, except that a coating solution 2 for an upper layer shown in Table 4 was used in place of the coating solution 1 for an upper layer, lithographic printing plate precursor was obtained.

TABLE 4

| Coating solution 2 for upper layer | |
|---|---|
| Components | Amount |
| Polyurethane (1) of Synthesis Example 1 (25% solution) | 30.00 g |
| Infrared absorbing dye of Chemical Formula 8 | 0.15 g |
| Ethyl Violet | 0.03 g |
| Fluorine-based surfactant (Megafac F-176) (20% solution) | 0.05 g |
| 3-pentanone | 62.40 g |
| Propylene glycol 1-monomethylether 2-acetate | 7.37 g |

Examples 11 to 12

In the same manner as in Example 10, except that the polyurethane (2) or (3) obtained in Synthesis Examples 2 to 9 were used in place of the polyurethane (1), lithographic printing plate precursors were obtained.

Comparative Example 1

In the same manner as in Example 1, except that a coating solution 3 for an upper layer shown in Table 5 was used in place of the coating solution 1 for an upper layer, lithographic printing plate precursor was obtained.

TABLE 5

| Coating solution 3 for upper layer | |
|---|---|
| Components | Amount |
| m,p-cresol novolak resin (m/p = 6/4, Mw = 3,500) | 8.00 g |
| Ethyl Violet | 0.03 g |
| Fluorine-based surfactant (30% methyl ethyl ketone solution) | 0.05 g |
| Propylene glycol monomethyl ether | 91.95 g |

Comparative Example 2

In the same manner as in Example 1, except that an aqueous polyvinyl alcohol solution was used in place of the coating solution 1 for an upper layer, a lithographic printing plate precursor was obtained.

Comparative Example 3

In the same manner as in Example 1, except that no upper layer was formed, a lithographic printing plate precursor was obtained.

(Evaluation of Lithographic Printing Plate Precursor)

Using a CREO Trendsetter thermal exposure apparatus equipped with laser having a wavelength of 830 nm and an output of 40 W, imagewise exposure of the lithographic printing plate precursors of Examples 1 to 12 and Comparative Examples 1 to 3 was conducted. Each of the exposed lithographic printing plate precursors was developed with a water diluted developing solution having the composition shown in Table 6 using PS processor PK-910 (manufactured by Dainippon Screen Mfg. Co., Ltd.). The development was conducted under the conditions of 30° C. for 12 seconds. The pH of the diluted developing solution was from 10.7 to 10.0. A finishing gum PF-2 (manufactured by Kodak Polychrome Graphics Japan Ltd.) was used as a finishing liquid.

TABLE 6

| Composition of developing solution | |
|---|---|
| Components | Amount |
| Water | 72.64 g |
| Monoethanolamine | 0.66 g |
| Diethanolamine | 3.45 g |
| Pelex NBL (aqueous 35% solution, manufactured by Kao Corporation) | 17.72 g |
| Benzyl alcohol | 5.53 g |

(Development Latitude)

A lithographic printing plate precursor was exposed at a rate of 120 mj/cm$^2$ and then developed with developing solutions each having a different dilution rate. Developing properties of the laser exposed area and the state of the image area were evaluated. Development latitude was evaluated by the range of the dilution range which exhibits good image properties. Optimum dilution rate of the developing solution is present in the center of the development latitude width.

(Printing Durability)

A lithographic printing plate precursor was exposed at a rate of 120 mj/cm$^2$ and then developed with an optimum developing solution. The lithographic printing plate thus obtained was mounted to a printing press Roland R-201 and then printing durability was evaluated.

(Scratch Resistance)

While applying a load using a scratching testing machine equipped with a sapphire needle having a diameter of 1.0 mm, the surface of a lithographic printing plate precursor was scratched. After the plate was developed with an optimum developing solution, a maximum load value at which no scratch was formed at the scratching portion was determined.

Evaluation results of development latitude, printing durability and scratch resistance are shown in Table 7.

TABLE 7

| Evaluation results | | | | |
|---|---|---|---|---|
| | Resin of upper layer | Development latitude | Printing durability (pieces) | Scratch resistance (g) |
| Example 1 | Polyurethane 1 | 1:4-1:7 | 180,000 | 6 |
| Example 2 | Polyurethane 2 | 1:5-1:8 | 170,000 | 5 |
| Example 3 | Polyurethane 3 | 1:4-1:7 | 200,000 | 6 |
| Example 4 | Polyurethane 4 | 1:4.5:1:7 | 180,000 | 5 |
| Example 5 | Polyurethane 5 | 1:4.5:1:7.5 | 180,000 | 5 |
| Example 6 | Polyurethane 6 | 1:3-1:6 | 200,000 | 6 |
| Example 7 | Polyurethane 7 | 1:3.5-1:6 | 190,000 | 6 |
| Example 8 | Polyurethane 8 | 1:4-1:7 | 180,000 | 5 |
| Example 9 | Polyurethane 9 | 1:4.5-1:7 | 190,000 | 6 |
| Example 10 | Polyurethane 1 | 1:3.5-1:6.5 | 180,000 | 6 |
| Example 11 | Polyurethane 2 | 1:4.5-1:7.5 | 170,000 | 5 |
| Example 12 | Polyurethane 3 | 1:3.5-1:7 | 200,000 | 6 |
| Comparative Example 1 | Novolak | (1:3-1:4) * | 170,000 | 6 |
| Comparative Example 2 | Polyvinyl alcohol | 1:7.5-1:8 | 130,000 | 4 |
| Comparative Example 3 | None | Only 1:8 | 120,000 | 1 |

* insoluble in developing solution, layer was peeled off on development

As is apparent from the results shown in Table 7, the lithographic printing plate precursors of Examples 1 to 12 exhibit good developing properties using a developing solution having the pH of 11 or lower and also have high printing durability and good scratch resistance, as compared with the lithographic printing plate precursors of Comparative Examples 1 to 3.

The invention claimed is:

1. An infrared-sensitive or heat-sensitive lithographic printing plate precursor, comprising:

a substrate, a first image recording layer formed on the substrate, and a second image recording layer formed on the first image recording layer, wherein the first image recording layer contains a resin which is soluble or dispersible in an aqueous alkali solution, and the second image recording layer contains a polyurethane which has a substituent having an acidic hydrogen atom.

2. The lithographic printing plate precursor of claim 1, wherein the substituent having an acidic hydrogen atom is a carboxyl group.

3. The lithographic printing plate precursor of claim 1, wherein the first image recording layer and/or the second image recording layer contain a photothermal conversion material.

4. The lithographic printing plate precursor of claim 1, wherein the resin is soluble or dispersible in an aqueous alkali solution that has the pH of 11 or lower.

5. The lithographic printing plate precursor of claim 1 wherein the resin in the first image recording layer has at least one functional group that is a hydroxyl, carboxyl, sulfonic acid, phosphoric acid, imide, or amide group.

6. The lithographic printing plate precursor of claim 1 wherein the resin in the first image recording layer is a copolymer produced by polymerizing at least one ethylenically unsaturated monomer having a functional group that is a hydroxyl, carboxyl, sulfonic acid, phosphoric acid, imide, or amide group.

7. The lithographic printing plate precursor of claim 6 wherein the ethylenically unsaturated monomer is represented by the following formula:

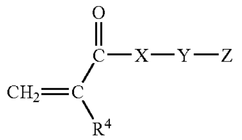

wherein $R^4$ represents a hydrogen atom, a $C_{1-22}$ linear, branched or cyclic alkyl group, a $C_{1-22}$ linear, branched or cyclic substituted alkyl group, or a $C_{6-24}$ aryl or substituted aryl group; X represents O, S or $NR^5$, $R^5$ represents hydrogen, a $C_{1-22}$ linear, branched or cyclic alkyl group, a $C_{1-22}$ linear, branched or cyclic substituted alkyl group or a $C_{6-24}$ aryl group or substituted aryl group; Y represents a single bond, or $C_{1-22}$ linear, branched or cyclic alkylene, alkyleneoxyalkylene, poly(alkyleneoxy)alkylene or alkylene-NHCONH; and Z represents a hydrogen atom, a hydroxy group, carboxylic acid, $—C_6H_4—SO_2NH_2$, $—C_6H_3—SO_2NH_2(—OH)$, or a group represented by the following formula:

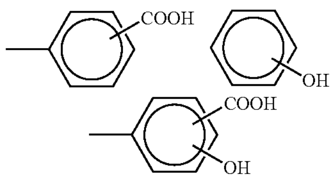

or or a mixture thereof.

8. The lithographic printing plate precursor of claim 6 wherein the ethylenically unsaturated monomer is acrylic acid or methacrylic acid.

9. The lithographic printing plate precursor of claim 1 wherein the resin in the first image recording layer is present in an amount of from 20 to 95% by weight based on the dry layer weight.

10. The lithographic printing plate precursor of claim 1 wherein the substituent having an acidic hydrogen atom is a carboxyl, $—SO_2NHCOO—$, $—CONHSO_2—$, $—CONHSO_2NH—$, or $—NHCONHSO_2—$ group.

11. The lithographic printing plate precursor of claim 1 wherein the polyurethane has a weight average molecular weight of from 2,000 to 100,000.

12. The lithographic printing plate precursor of claim 1 wherein the polyurethane is present in the second image recording layer in an amount of from 2 to 90% by weight based on the dry layer weight.

13. The lithographic printing plate precursor of claim 3 wherein the photothermal conversion material has a maximum absorption wavelength within the range of from 760 to 1200 nm.

14. The lithographic printing plate precursor of claim 3 wherein the photothermal conversion material is an infrared radiation absorbing dye.

15. The lithographic printing plate precursor of claim 14 wherein the photothermal conversion material is a cyanine dye.

16. An image forming method comprising the steps of imagewise exposing the lithographic printing plate precursor of claim 1 to form exposed and non-exposed areas, and developing the exposed lithographic printing plate precursor to remove the exposed areas.

17. The method of claim 16 wherein developing is carried out using an aqueous alkaline solution.

18. The method of claim 17 wherein developing is carried out using an aqueous alkaline solution having a pH of 11 or less.

19. The method of claim 17 wherein the aqueous alkaline solution contains an organic solvent.

* * * * *